United States Patent [19]

Tsuji

[11] Patent Number: 5,083,237
[45] Date of Patent: Jan. 21, 1992

[54] ELECTRONIC PARTS AND ELECTRONIC DEVICE INCORPORATING THE SAME

[75] Inventor: Tetsuroûô Tsuji, Itami, Japan

[73] Assignee: Mitsubishi Denki Kabushiki Kaisha, Tokyo, Japan

[21] Appl. No.: 576,789

[22] Filed: Sep. 4, 1990

[30] Foreign Application Priority Data

Nov. 14, 1989 [JP]   Japan ............................ 1-296825

[51] Int. Cl.⁵ .............................................. H05K 1/16
[52] U.S. Cl. .................................................. 361/402
[58] Field of Search ............................... 361/402, 404

[56] References Cited

U.S. PATENT DOCUMENTS

| | | | |
|---|---|---|---|
| 3,671,812 | 6/1972 | Peluso et al. | 361/400 |
| 4,130,722 | 12/1978 | Levijoki | 174/68.5 |
| 4,652,848 | 3/1987 | Hundrieser | 361/402 |
| 4,855,866 | 8/1989 | Imamura et al. | 361/402 X |
| 4,882,656 | 11/1989 | Menzies, Jr. et al. | 361/393 |

FOREIGN PATENT DOCUMENTS

| | | |
|---|---|---|
| 0065425 | 11/1982 | European Pat. Off. . |
| 0180438 | 5/1986 | European Pat. Off. . |
| 2169751 | 7/1986 | United Kingdom . |
| 2202375 | 9/1988 | United Kingdom . |

*Primary Examiner*—Donald A. Griffin
*Attorney, Agent, or Firm*—Oblon, Spivak, McClelland, Maier & Neustadt

[57] ABSTRACT

In the inventive electronic parts, external leads are installed at a board on which a multilayer capacitor is mounted, external leads being electrically connected with terminal electrodes of the capacitor through conductors which are provided on the board. And therefore it is possible to easily fabricate the capacitor into an electric device in three-dimensions through the external leads.

6 Claims, 6 Drawing Sheets

ELECTRONIC PARTS AND ELECTRONIC DEVICE INCORPORATING THE SAME

BACKGROUND OF THE INVENTION

1. Field of the Invention

The present invention relates to an electronic parts, which incorporates a multilayer capacitor, suitable for mounting the multilayer capacitor in three-dimensions and an electronic device incorporating the electronic parts.

2. Description of the Prior Art

Generally, a multilayer ceramic capacitor has laminated elements each of which is formed by joining a pair of electrodes made of metal such as silver-palladium or the like to both surfaces of a dielectric the main material of which is titanium oxide or barium titanate.

FIG. 1 is a perspective view showing a conventional multilayer ceramic capacitor, FIG. 2 is a plan view of the capacitor, FIG. 3 is a side view of the capacitor, and FIG. 4 is a sectional view taken along line IV—IV of FIG. 1.

Referring to FIGS. 1 to 4, a multilayer ceramic capacitor 1 has a dielectric 2, a plurality of internal electrodes 3 laminated through the dielectric 2 in an inner part of the capacitor 1, and terminal electrodes 4 connected with the internal electrodes 3 respectively. The terminal electrodes 4 consist of a first terminal electrode 4a provided at one end of the capacitor 1 and a second terminal electrode 4b provided at the other end of the capacitor 1. The terminal electrodes 4 forms a part of an external surface of the capacitor 1, as shown in FIGS. 1 to 3. The internal electrodes 3 consist of electrode layers 3a allocated at an odd position and the other electrode layers allocated at an even position, and the electrode layers 3a are connected with the first terminal electrode 4a while the other electrode layers 3b are connected with the second terminal electrode 4b.

The capacitor 1, for example, is mounted on a mother board 5 with a semiconductor element 6, as shown in FIG. 5. Continuing with the explanation more precisely, soldering pastes 7 are previously printed at prescribed positions on the mother board 5. The capacitor 1 and the semiconductor element 6 are put on the prescribed positions corresponding to the soldering pastes 7, respectively. In that state, it is quickly heated to melt the soldering pastes 7, and thereafter it is cooled, so that the soldering pastes 7 is solidified and the capacitor 1 and the semiconductor element 6 are securely affixed to the mother board 5 through the soldering pastes 7.

As described above, the multilayer ceramic capacitor 1 has been mounted on the mother board 5 in two-dimensions. Lately, however, it causes a need of mounting the capacitor 1 in three-dimensions in accordance with the demand of miniaturizing electronic parts and mounting the same in high density. According to the conventional multilayer ceramic capacitor 1, however, a terminal formed by the terminal electrodes 4 form a part of the external surface of the capacitor 1, which eventually makes it difficult to mount the capacitor 1 in three-dimensions.

SUMMARY OF THE INVENTION

The present invention is directed to an electronic parts incorporating a multilayer capacitor and an electronic device incorporating the electronic parts.

The inventive electronic parts comprises a board; conductors which are provided on the board; external leads which are installed at the board and electrically connected with the conductors respectively; and a multilayer capacitor having a plurality of internal electrodes laminated through a dielectric in an inner part of the capacitor and terminal electrodes which are provided on a surface of the capacitor and electrically connected with the internal electrodes respectively, the terminal electrodes being electrically connected with the conductors respectively.

The inventive electronic device comprises: (a) a pair of printed wiring boards allocated to face each other; and (b) an electronic parts allocated between the printed wiring boards. The electronic parts further including (b-1) a board, (b-2) conductors which are provided on the board, (b-3) external leads which are installed at the board and electrically connected with the conductors respectively, and (b-4) a multilayer capacitor having a plurality of internal electrodes laminated through a dielectric in an inner part of the capacitor and terminal electrodes which are provided on a surface of the capacitor and electrically connected with the internal electrodes respectively, the terminal electrodes being electrically connected with the conductors respectively; the external leads being connected with the printed wiring boards respectively.

Accordingly, a principal object of the present invention is to provide an electronic parts incorporating a multilayer capacitor which can mount the multilayer capacitor in three-dimensions.

Another object of the present invention is to provide an electronic device in which an electronic parts incorporating a multilayer capacitor is fabricated in three dimensions.

According to the inventive electronic parts, the external leads are installed at the board on which the multilayer capacitor is mounted, and therefore it can be easily mounted in three dimensions on an electric equipment and so on through the external leads.

According to the inventive electronic device, the electronic parts is installed through the external leads between the printed wiring boards, and therefore it is possible to fabricate the electronic parts incorporating the multilayer capacitor in three-dimensions.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
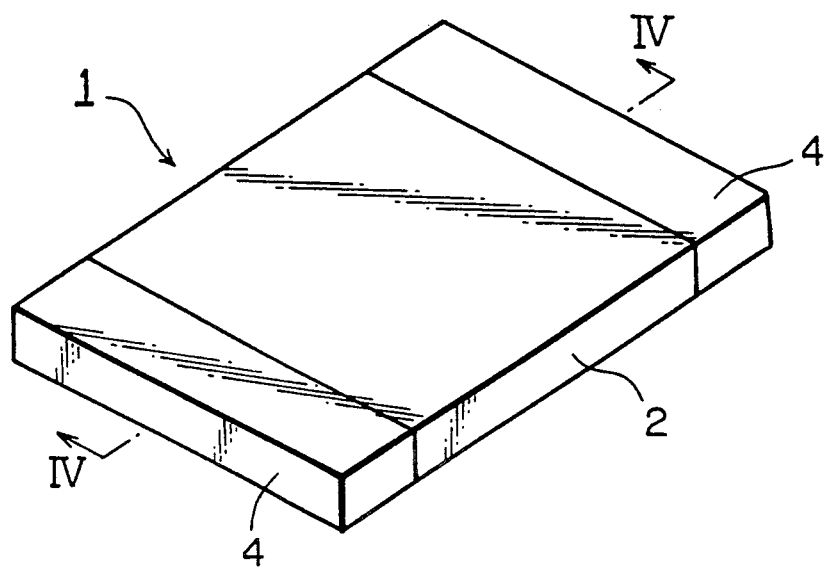
FIG. 1 is a perspective view showing a conventional multilayer ceramic capacitor.
Figure 3:
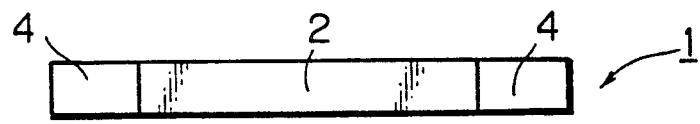
FIG. 3 is a side view of the capacitor.
Figure 2:
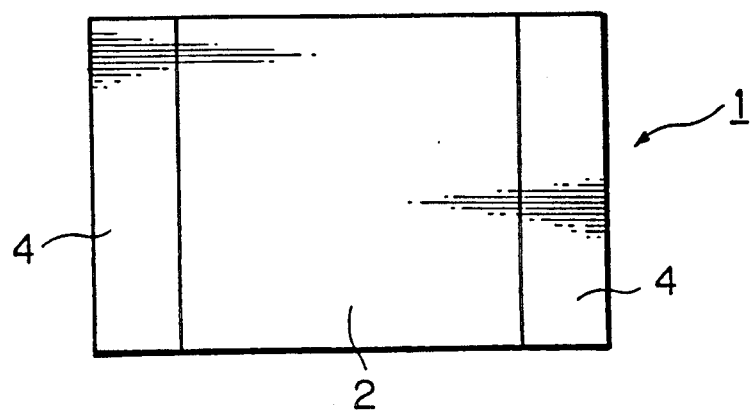
FIG. 2 is a plan view of the capacitor.
Figure 4:
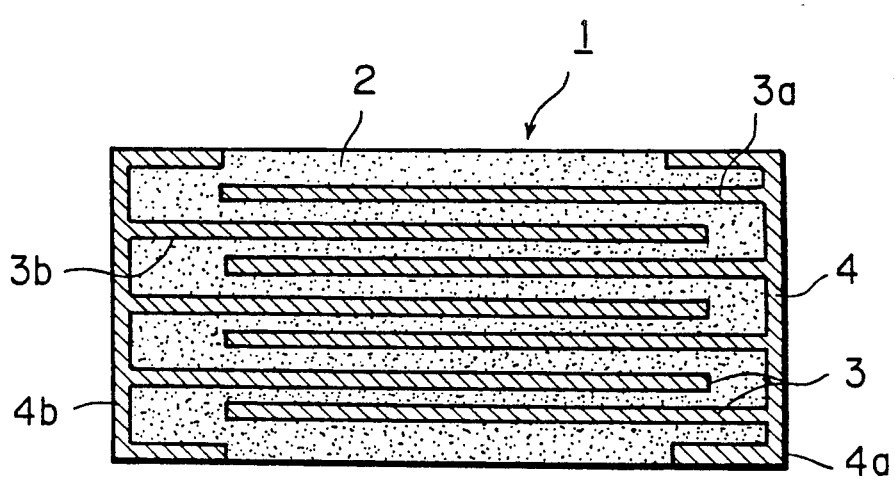
FIG. 4 is a sectional view taken along line IV—IV of FIG. 1.
Figure 5:
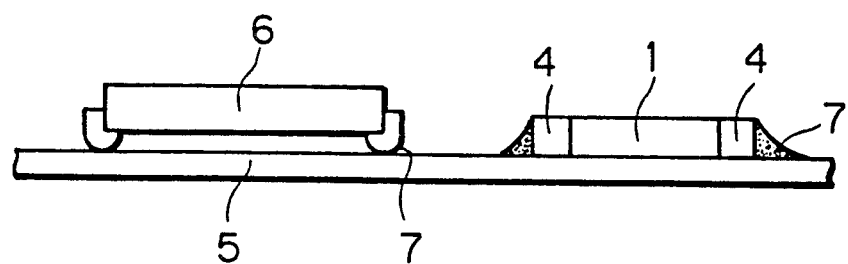
FIG. 5 is a view showing a state that the capacitor and a semiconductor element are mounted on a mother board.
Figure 6:
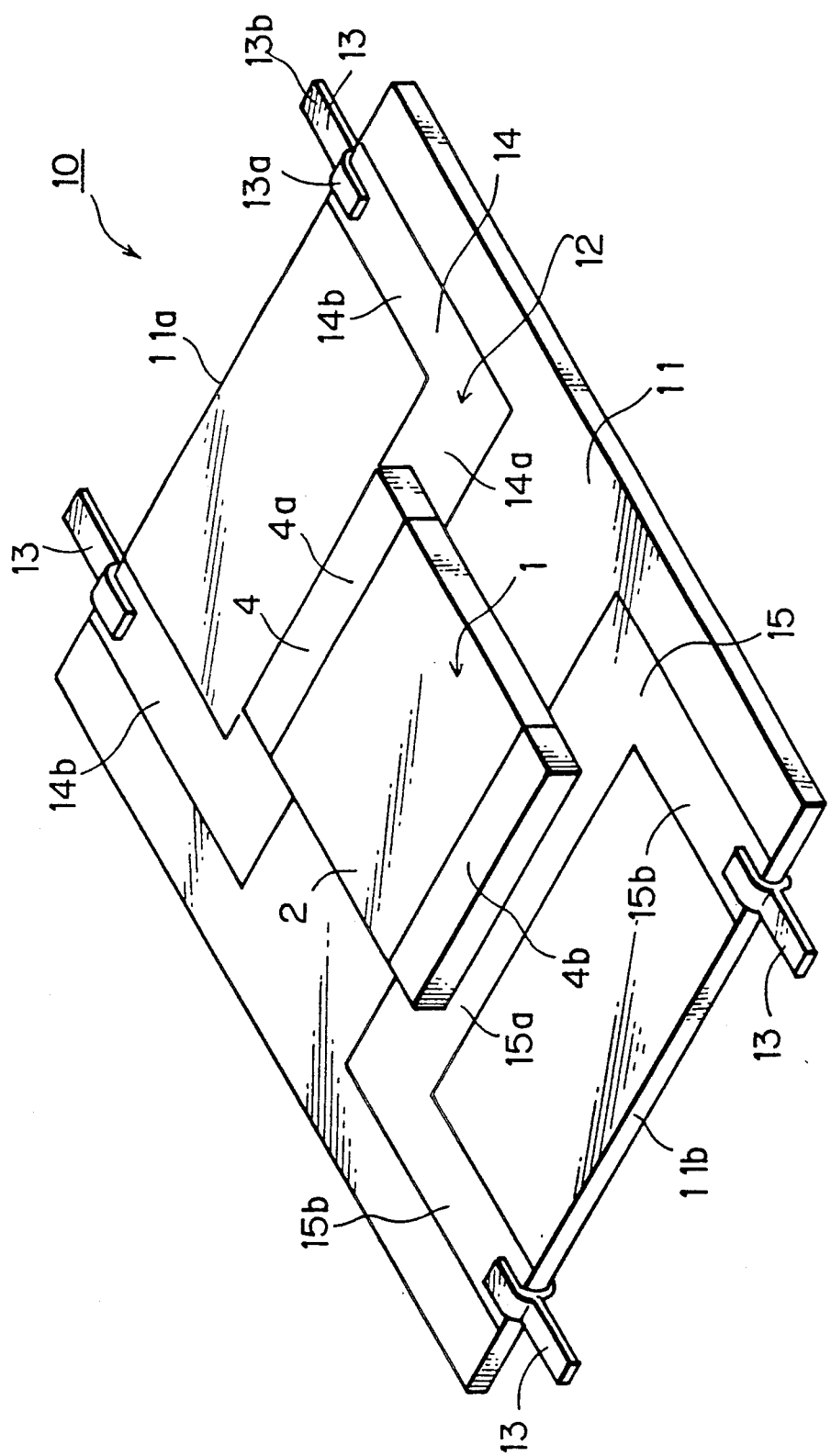
FIG. 6 is a perspective view showing an embodiment of an electronic parts according to the present invention.
Figure 7:
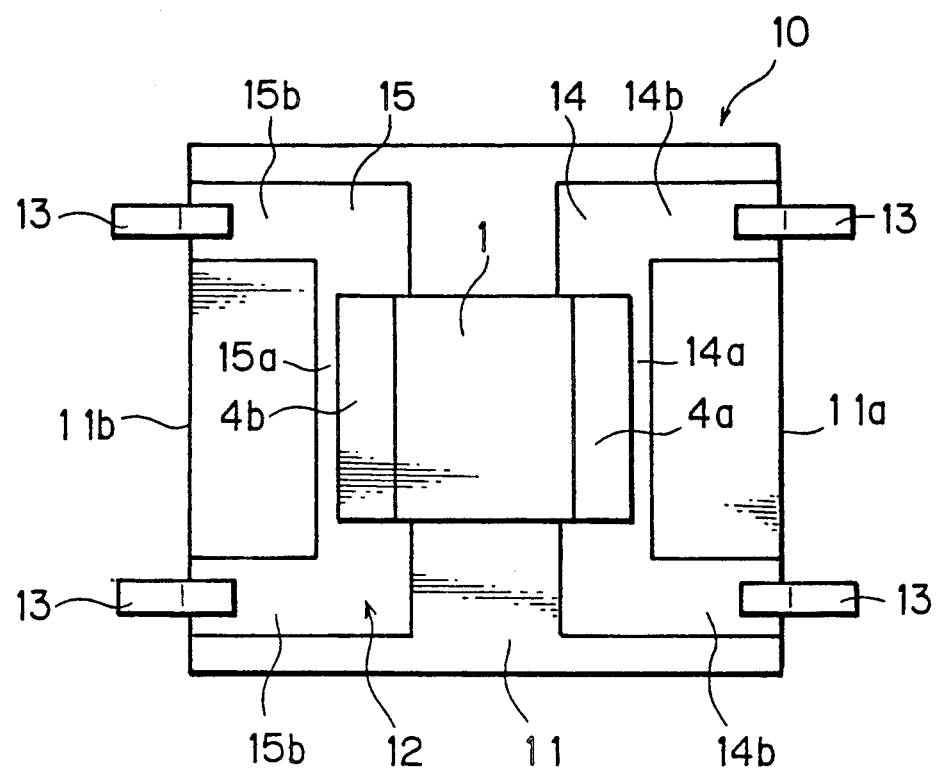
FIG. 7 is a plan view of the electronic parts.
Figure 8:
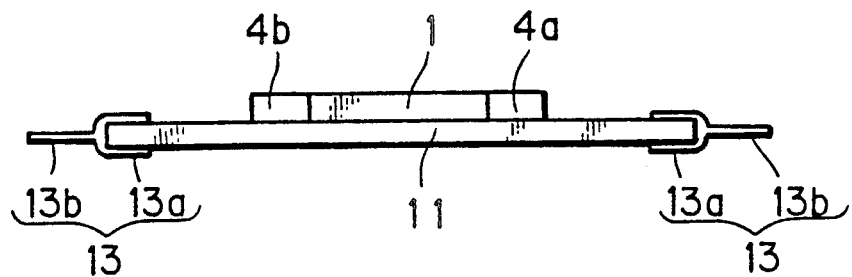
FIG. 8 is a side view of the electronic parts.

FIG. 6 is a perspective view showing an embodiment of an electronic parts according to the present invention, FIG. 7 is a plan view of the electronic parts, and FIG. 8 is a side view of the electronic parts.

Referring to FIGS. 6 to 8, an electronic parts 10 has a multilayer ceramic capacitor 1, a board 11 having conductors 12 thereon, and flexible external leads 13.

The board 11 is made by a ceramic board or the like. The conductors 12 consist of a first conductive pattern 14 provided on one area of a surface of the board 11 and a second conductive patter 15 provided on the other area of the surface of the board 11. Each of the first and second conductive patterns 14 and 15 is a U-shaped pattern consisting of a central part 14a, 15a and both side parts 14b, 15b, and tip ends of the both side parts 14b of the first conductive pattern 14 are allocated at one side 11a of opposed sides 11a and 11b of the board 11 while tip ends of the both side parts 15b of the second conductive pattern 15 are allocated at the other side 11b of the opposed sides 11a and 11b of the board 11.

The multilayer ceramic capacitor 1 has the same construction as the conventional multilayer ceramic capacitor 1 of FIGS. 1 to 4, and hence the same reference numerals as in FIGS. 1 to 4 are assigned to identical or equivalent parts in FIGS. 6 to 8 and a detailed explanation as to the construction thereof will be omitted. The capacitor 1 is put on the board 11 so that the first and second terminal electrodes 4a and 4b are allocated on the central parts 14a and 15a of the first and second conductive patterns 14 and 15, and the capacitor 1 is soldered to the board 11 with a dip soldering technique. Thus, the first and second terminal electrodes 4a and 4b are electrically connected with the first and second conductive patterns 14 and 15 respectively.

Each of the flexible external leads 13 made of metal has an U-shaped clip part 13a and a connecting part 13b extended from the clip part 13a. The external leads 13 are temporarily installed through the clip parts 13a to the opposed sides 11a and 11b of the board 11 so that the individual clip parts 13a contact to the tip ends of the both side parts 14b and 15b of the conductive patterns 14 and 15 respectively, and the external leads are soldered to the board 11 with dip soldering technique. Thus, the external leads 13 are electrically connected with the conductive patterns 14 and 15, respectively. Generally, the capacitor 1 and the external leads 13 are simultaneously soldered to the board 11 with the dip soldering technique.

Figure 9:
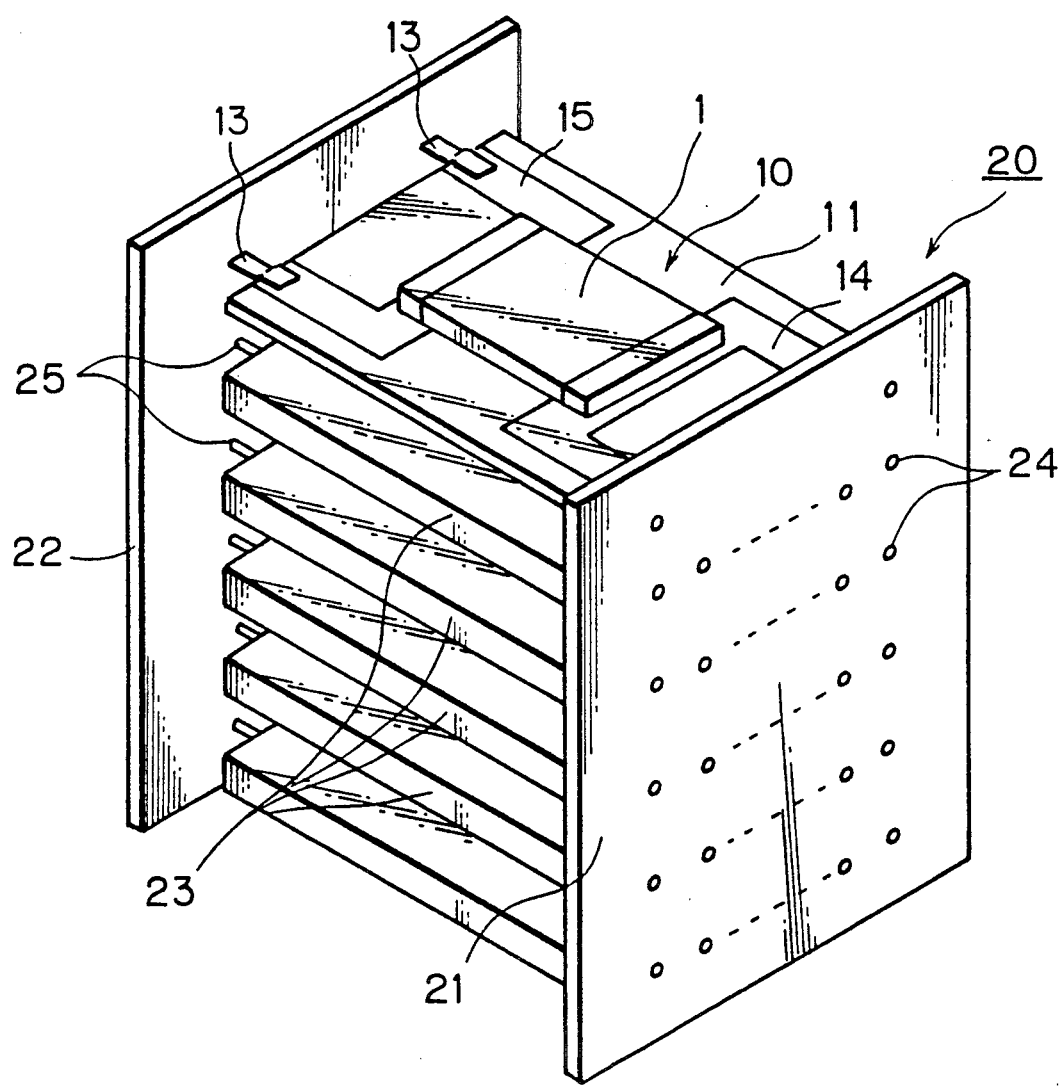
FIG. 9 is a perspective view showing an embodiment of an electronic device according to the present invention.
Figure 10:
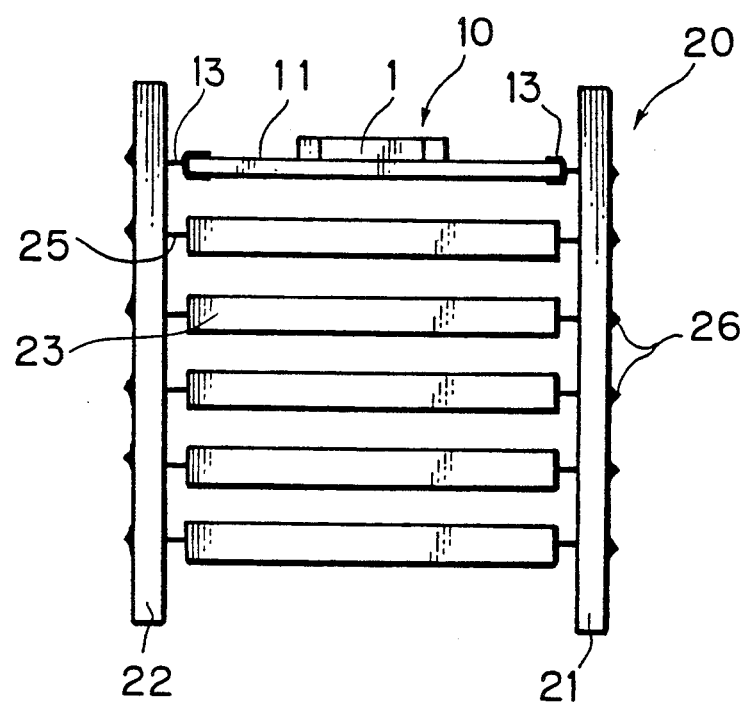
FIG. 10 is a side view of the electronic device.

The electronic parts 10 will be used, for example, as shown in FIGS. 9 and 10. FIG. 9 is a perspective view of an electronic device 20 incorporating the electronic parts 10, and FIG. 10 is a side view of the electronic device 20.

Referring to FIGS. 9 and 10, the electronic device 20 consists of a pair of printed wiring boards 21 and 22, semiconductor elements 23, and the above electronic parts 10. An external form of the board 11 in the electronic parts 10 is approximately equal to that of each semiconductor element 23. Each of the printed wiring boards 21 and 22 has a printed wiring pattern (not shown) on a surface thereof and through holes 24 for inserting the external leads 13 of the electronic parts 10 and leads 25 of the semiconductor elements 23.

The electronic device 20 will be fabricated as follows: First, the external leads 13 of the electronic parts 10 and leads 25 of the semiconductor elements 23 are inserted into the through holes 24 as shown in FIG. 9. Then, the external leads 13 of the electronic parts 10 and the leads 25 of the semiconductor elements 23 are soldered to the printed wiring boards 21 and 22 with a dip soldering technique. In FIG. 10, 26 designates solders.

According to the electronic parts 10, since the external leads 13 are installed at the board 11 on which the capacitor 1 is mounted, it is possible to easily incorporate the capacitor 1 into the electronic device 20 in three-dimensions.

In the above embodiment, although each of the conductive patterns 14 and 15 has an U-shape, it may have another shape. The conductors for electrically connecting the terminal electrodes 4 with the external leads 13 are not restricted to the conductive patterns 14 and 15, but the other means may be employed.

In the above embodiment, although a clip lead frame is used as the external lead 13, an ordinary lead may be employed in place of the clip lead frame.

In the above embodiment, although each of the external leads 13 is installed at an end of the board 11, another external lead which has one end affixed to a central part of the board 11 and the other end extended to an exterior of the board 11 may be employed.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An electronics parts incorporating a multilayer capacitor which has a plurality of internal electrodes laminated through a dielectric in an inner part of said capacitor and first and second terminal electrodes provided on both ends of said capacitor, respectively, and electrically connected with said internal electrodes, respectively, said electronic parts comprising:

a board;

first and second conductive patterns which are provided on two areas of a surface of said board with said first and second terminal electrodes connected with said first and second conductive patterns, respectively, and which are connected with said terminal electrodes at said multilayer capacitor;

wherein each of said first and second conductive patterns is in a U-shaped pattern consisting of a central part and two side parts, with the tip ends of each of said side parts of said first conductive pattern being allocated at one side of the opposed sides of said board while the tip ends of each of said side parts of said second conductive pattern are allocated at the other side of said opposite side of said board, with said first and second terminal electrodes being connected with said central parts of said first and second conductive patterns, respectively; and external leads which are connected with said tip ends of both side parts and said first and second conductive patterns respectfully.

2. An electronic parts of claim 1, each of said external leads is a clip lead frame consisting of a clip part for clipping an end of said board and a connecting part extended from said clip part for connecting to the other board.

3. An electronic parts of claim 1, said capacitor is a multilayer ceramic capacitor.

4. An electronic device comprising:
a pair of printed wiring boards allocated to face each other;
an electronic part allocated between said printed wiring boards with said electronic parts including a board,
first and second conductor patterns which are provided on said board which are in a U-shaped pattern consisting of a central part and two side parts with the tip ends of said side parts of said first conductive pattern being allocated at one side of opposed sides of said board with the tip ends of said side parts of said second conductive pattern being allocated to the other side of the opposed side of said board,
external leads which are placed on said board and electrically connected with said conductors respectively,
a multilayer capacitor having a plurality of internal electrodes laminated through a dielectric in an inner part of said capacitor and first and second terminal electrodes provided on both ends of said capacitor respectively, with said first and second terminal electrodes being connected with said first and second conductive patterns, respectively, at the central part of said first and second conductive patterns, respectively,
external leads which are connected with said tip ends of both side parts in said first and second conductive patterns respectively.

5. An electronic device of claim 4, each of said external leads is a clip lead frame consisting of a clip part for clipping an end of said board and a connecting part extended from said clip part for connecting to said printed wiring board.

6. An electric device of claim 4, said capacitor is a multilayer ceramic capacitor.

* * * * *